US011412630B2

(12) United States Patent
Mayfield

(10) Patent No.: US 11,412,630 B2
(45) Date of Patent: *Aug. 9, 2022

(54) DEVICES AND ACCESSORIES EMPLOYING A LIVING HINGE

(71) Applicant: GUI Global Products, Ltd., Houston, TX (US)

(72) Inventor: Walter G. Mayfield, Houston, TX (US)

(73) Assignee: GUI GLOBAL PRODUCTS, LTD., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/562,892

(22) Filed: Dec. 27, 2021

(65) Prior Publication Data

US 2022/0124926 A1    Apr. 21, 2022

Related U.S. Application Data

(63) Continuation of application No. 16/871,637, filed on May 11, 2020, now Pat. No. 11,212,929, which is a
(Continued)

(51) Int. Cl.
*G06F 1/16*    (2006.01)
*H05K 7/00*    (2006.01)
(Continued)

(52) U.S. Cl.
CPC ....... *H05K 5/0226* (2013.01); *A44B 18/0073* (2013.01); *A45C 11/00* (2013.01);
(Continued)

(58) Field of Classification Search
CPC .. H05K 5/0226; H05K 5/0086; H05K 5/0091; A45C 11/00; A45C 11/04;
(Continued)

(56) References Cited

U.S. PATENT DOCUMENTS 2,264,746 A    12/1941  Ellwood
2,359,374 A    10/1944  Lichty
(Continued)

FOREIGN PATENT DOCUMENTS

CN    201114710 Y    9/2008
EP    0517497 A2    12/1992
(Continued)

OTHER PUBLICATIONS

Whirlpool Advertisement, "Bye-Bye Front Loaders," p. 2 showing Mate Hug, pp. 1-21.
(Continued)

*Primary Examiner* — Anthony M Haughton
(74) *Attorney, Agent, or Firm* — Mossman, Kumar & Tyler, PC

(57) ABSTRACT

A device incorporating both a magnet and a living hinge may be employed to construct cases to protect electronic devices and to function as a closure for cases and lidded containers. Such cases often can be bent three 360° allowing the cases to be either closed protecting devices therein are closed upon themselves allowing the case to function to secure an electronic device to a substrate such as an article of clothing. The devices of the disclosure can also be used to organize and hold loose items together.

12 Claims, 10 Drawing Sheets

Related U.S. Application Data continuation of application No. 16/269,454, filed on Feb. 6, 2019, now Pat. No. 10,897,828, which is a continuation of application No. 15/881,458, filed on Jan. 26, 2018, now abandoned, which is a continuation of application No. 15/713,332, filed on Sep. 22, 2017, now abandoned, which is a continuation of application No. 14/440,548, filed as application No. PCT/US2013/068066 on Nov. 1, 2013, now abandoned.

(60) Provisional application No. 61/759,114, filed on Jan. 31, 2013, provisional application No. 61/722,401, filed on Nov. 5, 2012.

(51) Int. Cl.

| | |
|---|---|
| H05K 5/00 | (2006.01) |
| H05K 5/02 | (2006.01) |
| H01F 7/02 | (2006.01) |
| A45F 5/02 | (2006.01) |
| A45C 13/00 | (2006.01) |
| A45C 13/10 | (2006.01) |
| A45C 11/00 | (2006.01) |
| A44B 18/00 | (2006.01) |
| A45C 11/04 | (2006.01) |
| A45C 11/34 | (2006.01) |
| A45C 13/30 | (2006.01) |
| A45D 8/34 | (2006.01) |
| A45F 5/00 | (2006.01) |
| A45C 13/02 | (2006.01) |

(52) U.S. Cl.
CPC .............. *A45C 11/04* (2013.01); *A45C 11/34* (2013.01); *A45C 13/005* (2013.01); *A45C 13/1069* (2013.01); *A45C 13/30* (2013.01); *A45D 8/34* (2013.01); *A45F 5/02* (2013.01); *H01F 7/0263* (2013.01); *H05K 5/0086* (2013.01); *H05K 5/0091* (2013.01); *H05K 5/0204* (2013.01); *A44D 2203/00* (2013.01); *A45C 2011/002* (2013.01); *A45C 2011/003* (2013.01); *A45C 2013/025* (2013.01); *A45F 2005/008* (2013.01); *A45F 2005/023* (2013.01); *A45F 2200/0516* (2013.01); *A45F 2200/0525* (2013.01); *A45F 2200/0533* (2013.01); *A45F 2200/0541* (2013.01); *A45F 2200/0558* (2013.01); *A45F 2200/0575* (2013.01)

(58) Field of Classification Search
CPC ... A45C 11/34; A45C 13/005; A45C 13/1069; A45C 13/30
See application file for complete search history.

(56) References Cited

U.S. PATENT DOCUMENTS

| | | | |
|---|---|---|---|
| 2,454,888 A | 11/1948 | Shaw et al. | |
| 3,726,091 A | 4/1973 | Tontini | |
| 3,741,376 A | 6/1973 | Brown et al. | |
| 5,670,776 A | 9/1997 | Rothbaum | |
| 5,946,121 A | 8/1999 | Jiang et al. | |
| 6,076,790 A | 6/2000 | Richter | |
| 6,301,098 B1 | 10/2001 | Kim | |
| 6,809,774 B1 | 10/2004 | Yamazaki et al. | |
| 6,922,333 B2 * | 7/2005 | Weng | G06F 1/1616 220/230 |
| 7,012,802 B2 | 3/2006 | Nakajima et al. | |
| 7,130,654 B2 | 10/2006 | Cho | |
| 7,161,578 B1 | 1/2007 | Schneider | |
| 7,195,362 B2 | 3/2007 | Kumagai | |
| 7,211,986 B1 | 5/2007 | Flowerdew et al. | |
| 7,251,197 B2 | 7/2007 | Yoshida et al. | |
| 7,548,040 B2 | 6/2009 | Lee et al. | |
| 7,620,195 B2 | 11/2009 | Bengtsson et al. | |
| 7,627,289 B2 | 12/2009 | Huddart | |
| 7,631,811 B1 | 12/2009 | Brown | |
| 7,664,287 B2 | 2/2010 | Neu et al. | |
| 7,761,091 B2 | 7/2010 | Dunn et al. | |
| D636,659 S | 4/2011 | Rothbaum et al. | |
| D645,333 S | 9/2011 | Rothbaum et al. | |
| D647,519 S | 10/2011 | Rothbaum et al. | |
| 8,047,365 B1 | 11/2011 | Lin et al. | |
| 8,064,194 B2 | 11/2011 | Szeremeta | |
| 8,086,281 B2 | 12/2011 | Rabu et al. | |
| 8,216,416 B2 | 7/2012 | Allison et al. | |
| 8,234,509 B2 | 7/2012 | Gioscia et al. | |
| D667,291 S | 9/2012 | Rothbaum et al. | |
| D669,062 S | 10/2012 | Rothbaum et al. | |
| D671,101 S | 11/2012 | Rothbaum et al. | |
| D671,102 S | 11/2012 | Rothbaum et al. | |
| D671,103 S | 11/2012 | Rothbaum et al. | |
| D671,104 S | 11/2012 | Rothbaum et al. | |
| D671,105 S | 11/2012 | Rothbaum et al. | |
| D671,106 S | 11/2012 | Rothbaum et al. | |
| D671,107 S | 11/2012 | Rothbaum et al. | |
| D671,108 S | 11/2012 | Rothbaum et al. | |
| D671,109 S | 11/2012 | Rothbaum et al. | |
| D675,505 S | 2/2013 | Rothbaum et al. | |
| D675,903 S | 2/2013 | Rothbaum et al. | |
| D675,904 S | 2/2013 | Rothbaum et al. | |
| D676,033 S | 2/2013 | Rothbaum et al. | |
| D676,837 S | 2/2013 | Rothbaum et al. | |
| D682,070 S | 5/2013 | Rothbaum et al. | |
| D691,462 S | 10/2013 | Rothbaum et al. | |
| 8,688,037 B2 | 4/2014 | Chatterjee et al. | |
| 8,737,650 B2 | 5/2014 | Pedersen | |
| 8,787,016 B2 | 7/2014 | Rothkopf et al. | |
| 8,953,310 B2 | 2/2015 | Smith et al. | |
| 9,923,587 B2 * | 3/2018 | Aldana | G06F 1/1626 |
| 10,583,464 B1 | 3/2020 | Mayfield et al. | |
| 2003/0005558 A1 | 1/2003 | Wong | |
| 2003/0164895 A1 | 9/2003 | Minikanoja et al. | |
| 2004/0227998 A1 | 11/2004 | Aoshima et al. | |
| 2004/0240164 A1 | 12/2004 | Lee | |
| 2005/0107131 A1 | 5/2005 | Abramov | |
| 2005/0284904 A1 | 12/2005 | Knapp et al. | |
| 2006/0041746 A1 | 2/2006 | Kirkup et al. | |
| 2006/0111044 A1 | 5/2006 | Keller | |
| 2006/0152576 A1 | 7/2006 | Kiessling et al. | |
| 2006/0166715 A1 | 7/2006 | Van Engelen et al. | |
| 2006/0238281 A1 | 10/2006 | Steinberg | |
| 2006/0282993 A1 * | 12/2006 | Dietz | B43K 23/001 24/303 |
| 2007/0060224 A1 | 3/2007 | Liu | |
| 2007/0133156 A1 * | 6/2007 | Ligtenberg | G06F 1/1616 361/679.3 |
| 2007/0135185 A1 | 6/2007 | Dvorak et al. | |
| 2007/0145255 A1 | 6/2007 | Nishikawa et al. | |
| 2008/0012706 A1 | 1/2008 | Mak-Fan et al. | |
| 2008/0070501 A1 | 3/2008 | Wyld | |
| 2008/0076489 A1 | 3/2008 | Rosener et al. | |
| 2008/0085617 A1 | 4/2008 | Bevirt | |
| 2008/0103637 A1 | 5/2008 | Bliven et al. | |
| 2008/0132168 A1 | 6/2008 | Segev et al. | |
| 2008/0132293 A1 | 6/2008 | Gundlach et al. | |
| 2008/0136369 A1 | 6/2008 | Klemenz et al. | |
| 2008/0152182 A1 | 6/2008 | Bevirt et al. | |
| 2008/0157110 A1 | 7/2008 | Huang et al. | |
| 2008/0166005 A1 | 7/2008 | Terlizzi et al. | |
| 2008/0167088 A1 | 7/2008 | Rabu et al. | |
| 2008/0168286 A1 | 7/2008 | Tupman | |
| 2008/0244847 A1 | 10/2008 | Richter et al. | |
| 2008/0251338 A1 * | 10/2008 | Golden | G06F 1/1632 190/100 |
| 2009/0014105 A1 | 1/2009 | Shattuck | |
| 2009/0078478 A1 | 3/2009 | Newman | |
| 2009/0091708 A1 | 4/2009 | Greene | |
| 2009/0124308 A1 | 5/2009 | Lee | |

(56) References Cited

U.S. PATENT DOCUMENTS

| | | | |
|---|---|---|---|
| 2010/0011524 A1 | 1/2010 | Roeback et al. | |
| 2010/0124040 A1 | 5/2010 | Diebel et al. | |
| 2010/0195860 A1 | 8/2010 | Becker | |
| 2010/0227642 A1 | 9/2010 | Kim et al. | |
| 2010/0246103 A1* | 9/2010 | Visser | G06F 1/1616 361/679.01 |
| 2010/0298032 A1 | 11/2010 | Lee et al. | |
| 2011/0096513 A1* | 4/2011 | Kim | H04M 1/72409 361/728 |
| 2011/0117851 A1 | 5/2011 | Kim | |
| 2011/0151941 A1 | 6/2011 | Chan | |
| 2011/0167287 A1 | 7/2011 | Walsh et al. | |
| 2011/0192857 A1 | 8/2011 | Rothbaum et al. | |
| 2011/0199727 A1 | 8/2011 | Probst | |
| 2011/0211297 A1 | 9/2011 | Griffin et al. | |
| 2011/0218502 A1 | 9/2011 | Iio et al. | |
| 2011/0252605 A1 | 10/2011 | Rothbaum et al. | |
| 2011/0252606 A1 | 10/2011 | Rothbaum et al. | |
| 2011/0252607 A1 | 10/2011 | Rothbaum et al. | |
| 2011/0252608 A1 | 10/2011 | Rothbaum et al. | |
| 2011/0252609 A1 | 10/2011 | Rothbaum et al. | |
| 2011/0253571 A1 | 10/2011 | Rothbaum | |
| 2011/0304962 A1 | 12/2011 | Su | |
| 2011/0317865 A1 | 12/2011 | Stevinson | |
| 2012/0279756 A1 | 11/2012 | Rothbaum | |
| 2012/0326003 A1* | 12/2012 | Solow | F16M 11/041 248/688 |
| 2013/0097816 A1 | 4/2013 | Rothbaum et al. | |
| 2014/0151248 A1* | 6/2014 | Hurst | B65D 25/24 206/45.23 |
| 2018/0093303 A1 | 4/2018 | Mayfield et al. | |
| 2018/0117636 A1 | 5/2018 | Mayfield et al. | |
| 2018/0133759 A1 | 5/2018 | Mayfield et al. | |
| 2018/0345325 A1 | 12/2018 | Mayfield et al. | |
| 2019/0180898 A1 | 6/2019 | Lauder et al. | |
| 2019/0321863 A1 | 10/2019 | Mayfield et al. | |
| 2019/0321864 A1 | 10/2019 | Mayfield et al. | |
| 2020/0094291 A1 | 3/2020 | Mayfield et al. | |
| 2020/0114396 A1 | 4/2020 | Mayfield et al. | |

FOREIGN PATENT DOCUMENTS

| | | |
|---|---|---|
| EP | 2037661 A1 | 3/2009 |
| FR | 2912858 A1 | 8/2008 |
| JP | 2000037043 A | 2/2000 |
| JP | 2006074696 A | 3/2006 |
| JP | 06275962 | 10/2006 |
| JP | 2011234944 A | 1/2011 |
| JP | 2012016552 A | 1/2012 |
| JP | 2012143499 A | 8/2012 |
| KR | 200221906 | 4/2001 |
| KR | 200418285 | 6/2006 |
| KR | 1020080093178 A | 10/2008 |
| KR | 2020100004967 | 5/2010 |
| KR | 200456492 | 11/2011 |
| KR | 200457590 Y1 | 12/2011 |
| KR | 2020000008183 | 9/2013 |
| KR | 1020080108839 | 12/2018 |
| WO | 2010142290 A1 | 12/2010 |
| WO | 11129823 A1 | 10/2011 |
| WO | 11129847 A1 | 10/2011 |

OTHER PUBLICATIONS

Apple Online Advertisement, Case-Mate iPhone 3G_3GS Hug Wireless.
Wireless charging mats and receivers for your iPhone, iPod, BlackBerry and other devices | Powermat, 2 pp.
HP Official Store, Palm Touchstone Charging Deck, 1 pp.
Kaiser, Ryan, "Palm Touchstone Kit Review," 6 pp. (Jun. 5, 2009).
Newton, Harry; "Newton's Telecom Dictionary", 26th Expanded and Updated Edition; 1114 syntax error—systems analysis—3 pp. (2011).
Hughes, Scott, MIT Dept of Physics, Lecture 10: Magnetic Force; Magnetic Fields; Ampere's Law, pp. 89-97 (Mar. 10, 2005).
Lackie, John (General Editors); Chambers Dictionary of Science and Technology, p. 1182, 3 pp. (2007).
Pattison, Matthew et al., "Inclusive design and human factors: designing mobile phones for older users," PsychNology Jnl, vol. 4, No. 3 pp. 267-284 (2006).
Wireless Power Consortium, Inductive Power Transmission (2 pp.) available at: https:/lweb.archive.org/...b/2011 0821 051544/http://www. wirelesspowerconsortium .com/technology/basic-pri nci ple-of-inductive-power-transmission.html [Jan. 26, 2021 8:14:51 AM].
Bluetooth Doc, Bluetooth AudioNideo Working Group "AudioNideo Remote Control Profile," 52 pp., aw-feedback@bluetooth.org (May 22, 2003).
Plantronics, Voyager 855, Bluetooth Headset (User Guide) 20 pp. (2007).
JABRA Sport (User Manual) 16 pp. (2011).
PLANTRONICS, Discovery 975 (User Guide) 21 pp. (2009).
BPF: British Plastics Federation—Plastics in Electrical and Electronic Applications (2 pp.): https:/lweb.archive.org/web/2011 0811172429/https:/lwww.bpf.co.uklinnovation/plastics in electricaLand electronic applications.aspx [Jan. 27, 2021].
McEvoy, Aoife M., Review: "Next-Generation Stereo Bluetooth Headsets } TechHive"; 3 pp. PC World (Apr. 2009).
Motorola Elite Sliver, Bluetooth headset. "Check It Out", (User Guide), 38 pp. (2011).
ADAMS Magnetic Products | Magnetic Closures For Packaging: https:llwww.adamsmagnetic.com/blogs/magnet-blog-magnets-packaging-closures[Jan. 27, 2021 11:32:11 AM] (2 pp.).
MACBOOK Air shells and sleeves Review } Macworld: https:llweb. archive.org/web/20120403022106/https:llwww.macworld.com/article/ 1134919/airshellsleeve.html[Jan. 27, 2021 12:45:22 PM] (3 pp.).
ROHM Semiconductor, "Applications for Hall Effect IC Switches in Portable Electronics," 8 pp. (2009).
ASTM Dictionary of Engineering Science & Technology, p. 1 (3 p. ) (2005).
Plug Fones, https:llweb.archive.org/web/2011 0820072700/https:llwww. plugfones.com/[Feb. 3, 2021 8:06:34 AM] (3 pp.).
Beschizza, Rob, "CES: Hands on with the Kleer Wireless Earbuds" | Gadget Lab | Wired, 2 pp. (Jan. 2007).
Motorola, MC75A Enterprise Digital Assistant User Guide, 72E-133503-01 Rev. A, 232 pp. (Mar. 2010).
European Search Report in EP Application No. 12822174.4 dated Feb. 24, 2015.
Ganapati, Priya, Palm's Touchstone: Not Just a Wireless Charger, but a Whole Line of New Line of Products? https:/lwww.wired. com/2009/04/palm-slips-new, Apr. 2013, 4-5 pages.
https:/lwww.youtube.com/watch?v=bTMLQEDetB8; Retro Review: Palm Touchstone Wireless Charger Dock.
Int'l Search Report & Written Opinion in PCT/US2012/049562 (19 pp.), dated Jun. 2, 2013.
Korean Application No. 10-20157014760 Rejection dated Sep. 10, 2019.
PCT Application No. PCT/US2013/06806—International Search Report dated Feb. 19, 2014.
Indian Application No. 3127/CHENP/2015—Examination Report dated Feb. 2, 2019.
JP Application No. 2015-540823—Translation—Examination Report dated May 7, 2019.
GB Application No. GB1304785.7, Search Report dated Jul. 18, 2013.
Plantron ICS Discovery 975 Storage Case & Charger 79413-02 Brochure, 1 p.

* cited by examiner

DEVICES AND ACCESSORIES EMPLOYING A LIVING HINGE

CROSS-REFERENCE OF RELATED APPLICATIONS

This application is a Continuation of U.S. application Ser. No. 16/871,637 (U.S. Pat. No. 11,212,929), filed May 11, 2020, which is a Continuation in Part of U.S. application Ser. No. 16/269,454 (U.S. Pat. No. 10,897,828) filed on Feb. 6, 2019 which is a Continuation of U.S. application Ser. No. 15/881,458, filed Jan. 26, 2018, which is a Continuation of U.S. application Ser. No. 15/713,332, filed Sep. 22, 2017, which is a Continuation of Ser. No. 14/440,548, filed May 4, 2015, which is a 371 National Phase Entry of International Application No.: PCT/US2013/068066, filed Nov. 1, 2013, which claims benefit of 61/722,401, filed Nov. 5, 2012 and claims benefit of 61/759,114, filed Jan. 31, 2013 the entire disclosure of which is incorporated herein by reference in its entirety.

BACKGROUND OF THE INVENTION

1. Field of the Invention

The invention relates to an apparatuses and accessories incorporating living hinges. The invention particularly relates to such apparatuses and accessories used with electrical devices.

2. Background of the Art

In the past, cases used with electronic devices have primarily been employed for the purpose of protecting the device from its environment. For example, even with solid-state devices, it can be desirable to protect such devices from impacts. Thus, cases for such devices often included padding of one type or another to dampen the acceleration deceleration resulting from dropping such a device. Similarly, devices that were sensitive to moisture would have cases that excluded or at least mitigated moisture reaching the device.

More recently, such cases now are employed to both protect the devices and to free the hands of the users. In today's society, multitasking is no longer an option it is a requirement. For example, it is common to see people jogging or bicycling and using electronic devices that clip to their clothing or equipment.

It would be desirable in the art of producing electronic devices and accessories for such devices to either encase devices or design the devices themselves so that they may be carried and employed efficiently and conveniently.

SUMMARY OF THE INVENTION

In one aspect, the invention is an electronic device comprising two modules separated by a living hinge and further comprising a first magnet located on or within a first module and a second magnet or a ferromagnetic or ferrimagnetic substrate located on or within a second module wherein the electronic device is configured such that it may be used with the modules in an open position, and it may be stored by closing the modules with a target substrate between the modules such that the first magnet and the second magnet or a ferromagnetic or ferrimagnetic substrate function to adhere the device onto the target substrate.

In another aspect, the invention is a case for an electronic device comprising two modules separated by a living hinge and further comprising a first magnet located on or within a first module and a second magnet or a ferromagnetic or ferrimagnetic substrate located on or within a second module wherein the case is configured such that it may be stored by closing the modules with a target substrate between the modules such that the first magnet and the second magnet or a ferromagnetic or ferrimagnetic substrate function to adhere the device onto the target substrate. In some embodiments, the case may be configured to further secure accessories for the electronic device.

In still another aspect, the invention is a system comprising a case and a separate closure for the case wherein the closure for the case has two modules separated by a living hinge and further comprising a first magnet located on or within a first closure module and a second magnet or a ferromagnetic or ferrimagnetic substrate located on or within a second closure module and the case has two components separated by a hinge and a first magnet located on or within a the first case component and a second magnet or a ferromagnetic or ferrimagnetic substrate located on or within the second case component and the closure and case are configured such that the closure components adhere to the case components to hold them closed.

Another aspect of the invention is a system comprising a container and a separate closure for the container wherein the closure for the container has two closure modules separated by a living hinge and further comprising a first magnet located on or within a first closure module and a second magnet or a ferromagnetic or ferrimagnetic substrate located on or within a second closure module and the container has a body and a lid connect by a hinge and a first magnet located on or within a lid and a second magnet or a ferromagnetic or ferrimagnetic substrate located on or within the body and the closure and case are configured such that the closure adheres to both the lid and the body to hold them closed.

In still another aspect, the invention is a device comprising a first component and a second component separated by a living hinge and further comprising a first magnet located on or within a first module and a second magnet or a ferromagnetic or ferrimagnetic substrate located on or within a second component wherein the device is configured such that the first component and second component, can be brought together and the first magnet and the second magnet or a ferromagnetic or ferrimagnetic substrate function to hold the two components together and further secure objects between the components of the device. In some embodiments, the device may further secure the object to another object using magnetic, adhesive or mechanicals means.

In another embodiment, the invention is a device for attaching a magnetic object to a Tablet personal computer (PC) or other electronic device comprising a substrate having a first surface configured to receive the magnetic object, a second surface having an adhesive which serves to secure the device to the Tablet PC or other electronic device, and at least one band connected to the substrate using a living hinge which is configured to wrap around the magnetic device to secure it to the first surface of the device.

Another embodiment of the invention is an improvement to a device employing at least two magnets wherein the device is configured to receive an object being slid between the two magnets and secure it in place wherein the improvement comprises employing at least one insert between the object and one of the magnets wherein the insert is in the shape of a wedge.

In yet another embodiment the invention is a general-purpose device having at least two magnets to secure a substrate to an object wherein the substrate is adaptable to receiving many different components.

Another embodiment of the invention is a fiber or cord management system comprising a first tab, a living hinge, and a second tab wherein the living hinge is substantially more narrow than the tabs, the first tab has a single magnet, and the second tab has at least three magnets having the opposite polarity of the magnet on the first tab wherein the living hinge serves as a substrate upon which the fiber or cord may be wound and the first tab can be positioned to attach to the second tab by overlaying it with a point of attachment selected to maintain tension on the cord or fiber.

In still another embodiment, the invention is a specific-purpose device having at least two magnets to secure a substrate to an object wherein the substrate is adaptable to receiving components useful in converting a pair of glasses into smart glasses.

In another embodiment, the invention is a device comprising two modules with a living hinge between and a magnet within each of the modules and configured to make contact when the modules are bent towards each other and to hold the modules together in a closed position and further comprising a cleaning surface.

In still another embodiment, the invention is a method of affixing an object to a substrate comprising closing a device of the application upon the object and the substrate.

BRIEF DESCRIPTION OF THE DRAWINGS

The above and other features and advantages of the present invention will become more apparent by describing in detail embodiments thereof with reference to the attached drawings in which.

DESCRIPTION OF THE PREFERRED EMBODIMENTS

Figure 1:
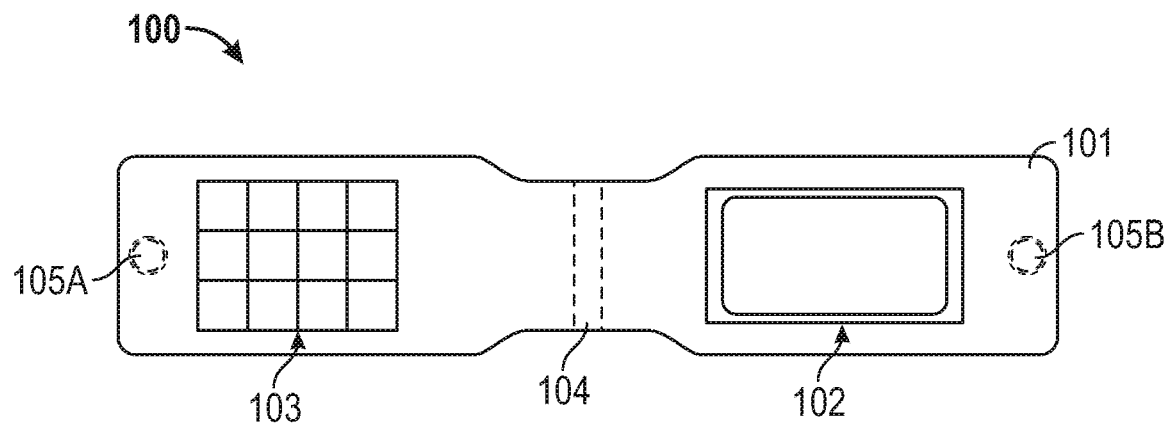
FIG. 1 illustrates an electronic device having two modules in the open position.

In one aspect, the invention is an electronic device comprising two modules separated by a living hinge. The term electronic device means such devices having a view screen and in some embodiments a keyboard component including, but not limited to cell phones, smartphones, some Tablet computers, laptop computers, iPod (a trade designation of the Apple® corporation) or other small music players, and the like.

The term "living hinge" means, for the purposes of the disclosure, a thin flexible hinge (flexure bearing) joining two components, as opposed to a mechanical hinge such as a pin hinge. In some embodiments it is made from the same material as the two pieces it connects. Where it is made from the same material as the components it connects, it may be of the same or differing thickness an even be just a natural bend point in a continuous material.

The embodiments of the devices and systems of the disclosure include a magnet and/or a ferromagnetic or ferrimagnetic component. The ferromagnetic or ferrimagnetic component may be made of iron or other conventional ferrimagnetic and ferrimagnetic materials. In may also be a composite. Exemplary composites include combinations of aluminum, nickel, and cobalt compound with iron. Such composites may be made by sintering metals or by mixing the metallic components with a resin and injection molding. Mixtures of iron oxide and ceramic components such as barium and strontium carbonate may be used to make ceramic magnets for use as the Ferromagnetic or ferrimagnetic components useful with the application. For the purposes of this application, rare earth magnets, such as but not limited to samarian and neodymium based magnets, are ferrimagnetic and ferrimagnetic materials and may be used to prepare the Ferromagnetic or ferrimagnetic components useful with the application. Any magnetic material or material that is attracted to magnets may be used to prepare the Ferromagnetic or ferrimagnetic components useful with the application.

In one embodiment, the invention is an electronic device comprising two modules separated by a living hinge and further comprising a first magnet located on or within a first module and a second magnet or a ferromagnetic or ferrimagnetic substrate located on or within a second module wherein the electronic device is configured such that it may be used with the modules in an open position, and it may be stored by closing the modules with a target substrate between the modules such that the first magnet and the second magnet or a ferromagnetic or ferrimagnetic substrate function to adhere the device onto the target substrate.

The electronic device can be attached to the module using any means known to those of ordinary skill in the art. For example, in one embodiment, an attach point already extant on the device such as a clip can be used to clip to the module by means of a slit or a loop. In another embodiment, a first magnet can be attached to the device and a second magnet attached to the module at a point of attachment where the device would be held in place by the two magnets. In still another embodiment, an adhesive can be used.

Turning to FIG. 1, such a device 100 is illustrated with the device having a screen or output element at reference number 102 and a keypad are input element at reference number 103. Reference numbers 105A and 105B are independently a first magnet or a second magnet or a ferromagnetic or ferrimagnetic substrate. In at least one embodiment of the disclosure, the first and second modules are adhered to a continuous piece of flexible material. This is designated by reference number 101. The living hinge is located at reference number 104. In some embodiments, the living hinge is located such that it is a natural point of bending for the continuous piece of flexible material.

In a different embodiment, the living hinge is made of a different material separating two separate pieces which make up the two modules of the device. In such embodiments, the materials making up the modules can be more rigid than the living hinge artifact may be a rigid material.

In all embodiments, the input element and output elements communicate with each other. This may be done by a wire running between them (not shown) art may be accomplished using an electronic protocol such as BLUETOOTH® or the like. In one embodiment, the device is a cell phone. In another embodiment, it may be a small Tablet personal computer. In all embodiments, the device may be bent at the hinge to bring the modules together such that the magnets are the magnet and a ferromagnetic or ferrimagnetic substrate may engage to hold the device in a closed position. The device may be open fully or partially for use.

Another embodiment of the invention is a case for an electronic device comprising two modules separated by a living hinge and further comprising a first magnet located on or within a first module and a second magnet or a ferromagnetic or ferrimagnetic substrate located on or within a second module wherein the case is configured such that it may be stored by closing the modules with a target substrate between the modules such that the first magnet and the second magnet or a ferromagnetic or ferrimagnetic substrate function to adhere the device onto the target substrate. In some embodiments, the case may be configured to further secure accessories for the electronic device.

Figure 2:
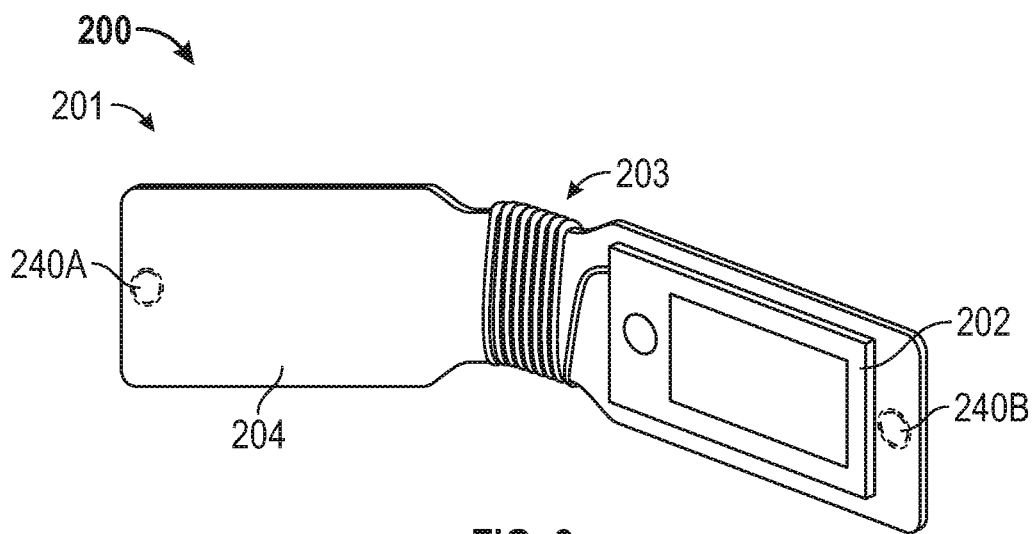
FIG. 2 illustrates an electronic device within a case in the open position.

Such a device (200) is illustrated in FIG. 2. In such an embodiment, an electronic device (202) is affixed to a first module of a continuous piece of flexible material (201). A living hinge (not shown) is beneath a cable for an accessory which is shown at reference number 203. In the illustrated embodiment there is a first magnet at reference number 205 and a second magnet or a ferromagnetic or ferrimagnetic substrate designated by reference number 205A. In this embodiment, the living hinge is formed by a narrowing of the continuous piece of flexible material which is also a convenient place for storing cables or wires for accessories.

One application of the device illustrated in FIG. 2 could be a digital music player. In such an application the accessory could be a power cable or an earplug. Just as with the previous device, the living hinge functions to enable the closing of the device so that the components can be covered by the continuous flexible material. In an alternative embodiment, the living hinge may join to rigid components to provide additional protection from the environment or a more stable operations platform.

When an electronic device, a magnet, a ferromagnetic or ferrimagnetic material, or any of the other components which may be applied to a case in the course of making embodiments the invention the disclosure, they may be adhered using a tacky adhesive. One such embodiment includes using double sided gaffer's tape as the source of the tacky adhesive. Any tacky adhesive can be used with the method of the application.

In some embodiments, the cases may be reversible and that one side may be a first color and the other side may be a second color. One advantage of employing magnetism to hold an electronic device in place on the case is that the user may select which side of the case they wish to use.

While the adhesive may be a tacky adhesive such as already discussed hereinabove, it may also be a permanent adhesive. Such permanent adhesives may be selected from acrylic emulsion adhesives, rubber-based adhesives, or any other suitable material exhibiting durable bonding qualities.

In other embodiments, components that are capable of being adhered by a magnet may be held in place using magnetism. For those components which would not otherwise be able to be held in place by the magnet, the component can be enveloped in a sheath having an integral magnet. In an alternative form of this embodiment, the sheath may only cover part of the component.

Additionally, components that are adhered in place to covers of the application may be adhered using any method known to be useful to those of ordinary skill in the art. This would include, of course, conventional means such as brads, rivets, screws, and other mechanical methods.

Figure 3:
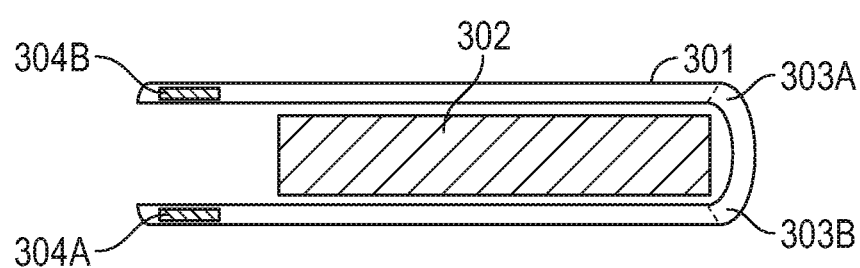
FIG. 3 illustrates an electronic device within a case having two living hinges.
Figure 4A:
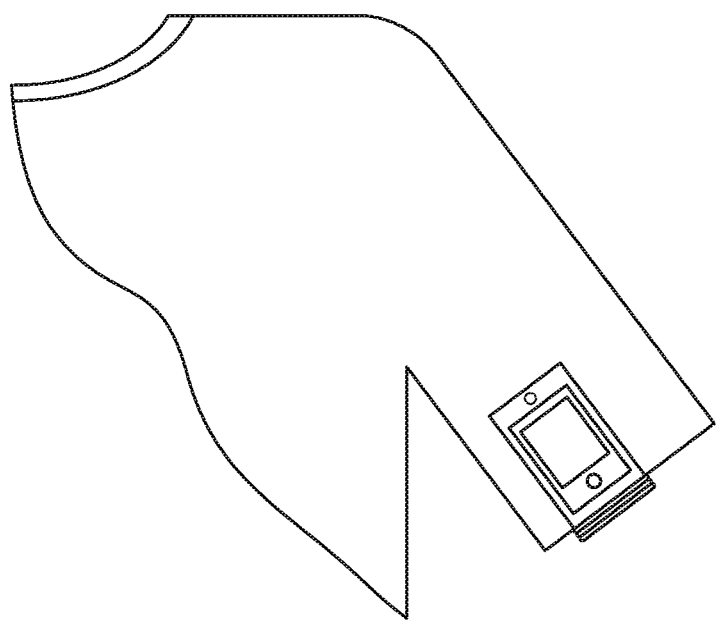
FIG. 4A illustrates an electronic device within a case and attached to a shirt with the device open for viewing.
Figure 4B:
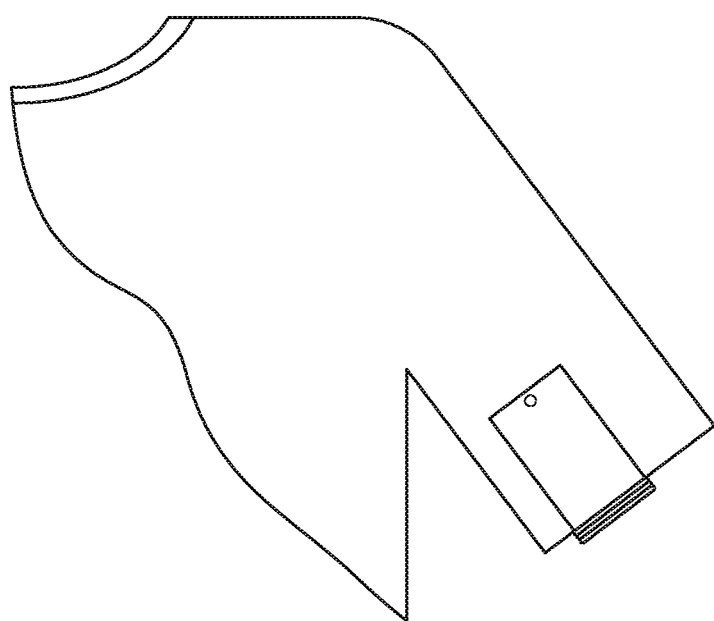
FIG. 4B illustrates an electronic device within a case and attached to a shirt with the device covered.

FIG. 3 illustrates several desirable aspects of the devices and systems of the disclosure. In this illustration, reference number 302 is an electronic device within a case containing the electronic device (300). The case is in the closed position. In this embodiment, the living hinge is actually two hinges which are designated by reference numbers 303A and 303B. While not actually touching, the magnets designated as 304A and 304B are sufficiently close to hold the two modules of the case closed. One especially useful aspect of this embodiment is illustrated in FIGS. 4A and 4B.

The living hinge can bend 360°. This means that the case illustrated can be closed to cover the electronic device or the case can be bent back to close against itself leaving the device open. If the case is closed back upon itself with something interposed, such as a shirt sleeve, then the case can function to hold the device in place thereby freeing the hands of the operator. In FIG. 4A the case is employed to hold an electronic device to a shirt sleeve in the open position to facilitate observation of the device by the user. In FIG. 4B, the use of the case to hold the electronic device in place on a shirt sleeve with a device covered by the case is illustrated.

Figure 5A:
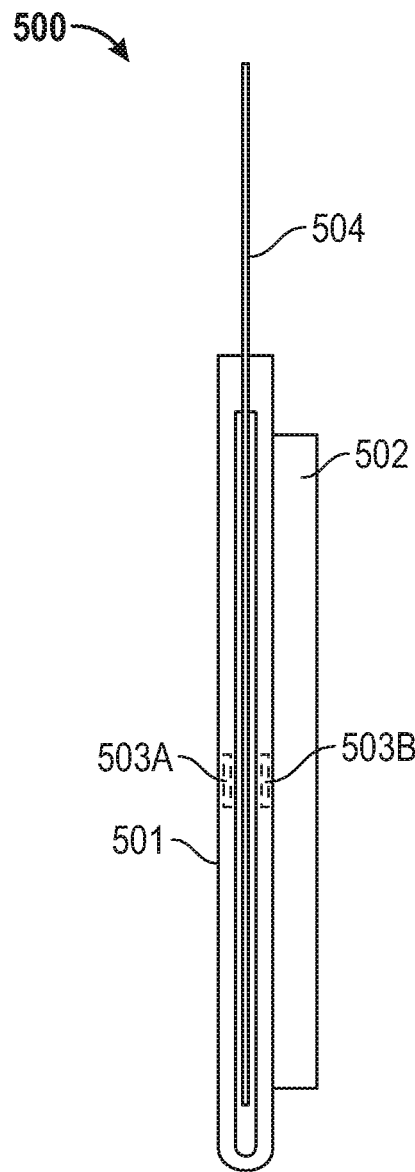
FIG. 5A illustrates an electronic device within a case with the device open for viewing.
Figure 5B:
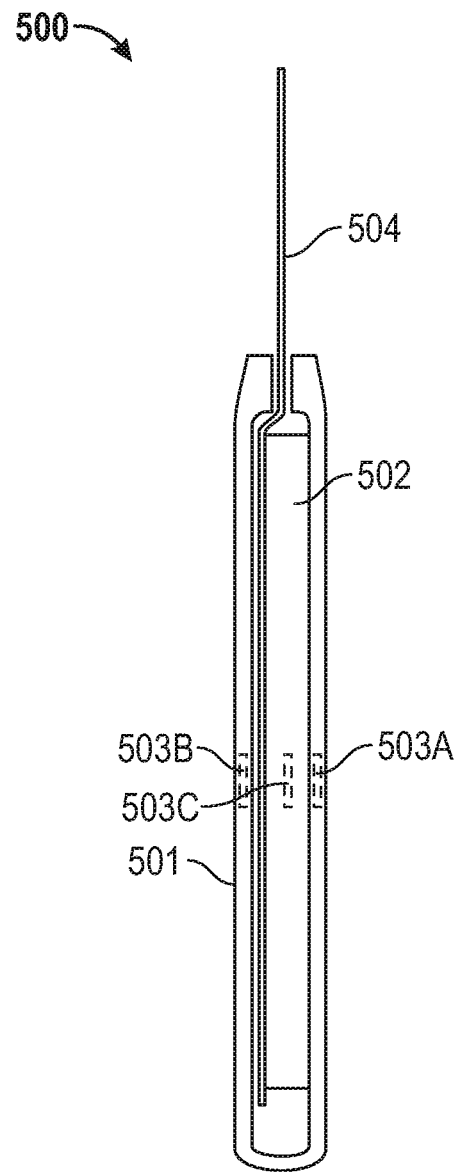
FIG. 5B illustrates an electronic device within a case with the device covered.

This concept is further illustrated in FIGS. 5A and 5B. These drawings illustrate a case (501) holding electronic component (502) on a substrate (504). The whole system is designated using the reference number 500. In FIG. 5A, the case is folded back upon itself leaving the electronic component visible. The cases help close using the magnets designated using reference numbers 503A and 503B.

In FIG. 5B, the case is folded in the closed position, protecting the electronic component. This embodiment also shows the use of a third magnet designated with the reference number 503C. The 503C magnet is located on or within the electronic component; which may be held in place using a sleeve (not shown).

Figure 6:
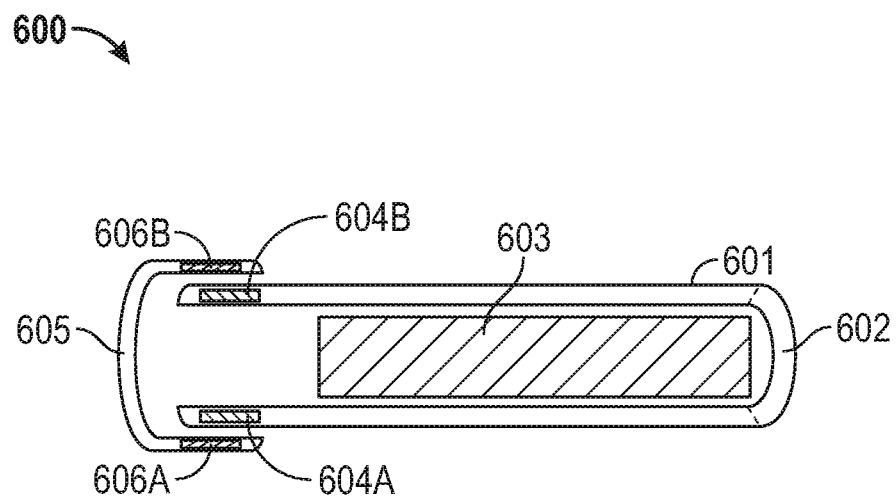
FIG. 6 illustrates an electronic device within a case but employing a separate closure.

In another embodiment, the invention is a system comprising a case and a separate closure for the case wherein the closure for the case has two modules separated by a living hinge and further comprising a first magnet located on or within a first closure module and a second magnet or a ferromagnetic or ferrimagnetic substrate located on or within a second closure module and the case has two components separated by a hinge and a first magnet located on or within a the first case component and a second magnet or a ferromagnetic or ferrimagnetic substrate located on or within the second case component and the closure and case are configured such that the closure components adhere to the case components to hold them closed. This embodiment is illustrated in FIG. 6 wherein the whole system is designated using reference number 600. Similar to the illustrations above, the case (601) protects an electronic device (603) includes a living hinge (602) which includes a magnet or a ferromagnetic or ferrimagnetic substrate designated using the reference numbers 604A and 604B. In this embodiment, the case is not held closed using the magnets located within our on it. Instead, the case is held closed using the separate closure designated using reference number 605. A magnet or a ferromagnetic or ferrimagnetic substrate in the separate closure (606A and 606B) engages with their opposite number in the case to hold the case closed.

In some embodiments of this aspect of the invention, the separate closure is flexible and may be adhered in place on the case even when the case is open.

In a related embodiment, the invention is a system comprising a container and a separate closure for the container wherein the closure for the container has two closure modules separated by a living hinge and further comprising a first magnet located on or within a first closure module and a second magnet or a ferromagnetic or ferrimagnetic substrate located on or within a second closure module and the container has a body and a lid connect by a hinge and a first magnet located on or within a lid and a second magnet or a ferromagnetic or ferrimagnetic substrate located on or within the body and the closure and case are configured such that the closure adheres to both the lid and the body to hold them closed. This embodiment is illustrated in FIG. 7.

Figure 7:
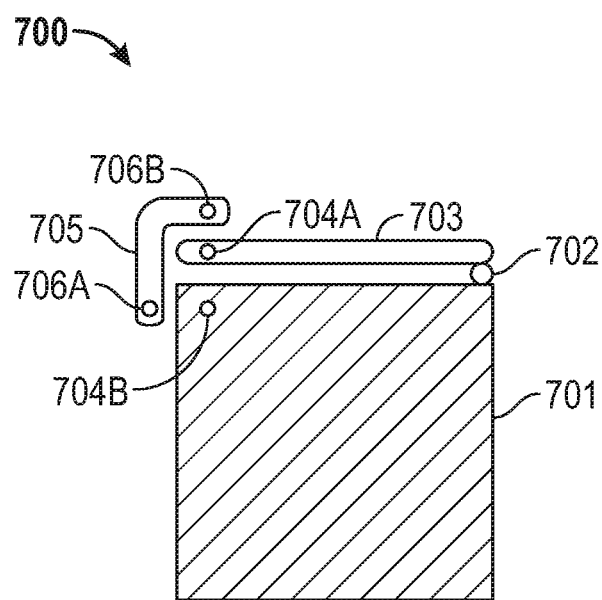
FIG. 7 illustrates a container with a lid which is secured closed using a separate closure.

In FIG. 7, the system (700) includes both a container designated using reference number 701 and a lid designated using reference number 703. The lid is connected to the container using a hinge (702). The container includes two magnets or ferromagnetic or ferrimagnetic substrates which are designated using reference numbers 704A and 704B. It should be noted that the 704A and 704B magnets or ferromagnetic or ferrimagnetic substrates do not function to hold the lid closed. It is a use of a separate closure (705) which also has magnets or ferromagnetic or ferrimagnetic substrates (706A and 706B) which are configured such that the closure adheres to both the lid and the container to hold them closed.

In still another embodiment of the method of the disclosure, a device comprising a first component and a second component separated by a living hinge and further comprising a first magnet located on or within a first module and a second magnet or a ferromagnetic or ferrimagnetic substrate located on or within a second component wherein the device is configured such that the first component and second component, can be brought together and the first magnet and the second magnet or a ferromagnetic or ferrimagnetic substrate function to hold the two components together and further secure objects between the components of the device. In some embodiments, the device may further secure the object to another object using magnetic, adhesive or mechanicals means.

The practical application of this last embodiment is very broad and sweeping. For example, this device can be used to hold things together such as, golf markers, tees, did holders, pencils, ammunition, cigars, paper clips, and the like. In addition to keeping these articles together, as illustrated above, they may be then further secured to an article of clothing or the like. This embodiment is even broader in scope as conventional means of affixing the device holding the collection of items may be employed.

In addition to organizing a collecting of articles, single items may be affixed to clothing or other locations using this device. For example, single items which may be affixed to substrates such as clothing using this device, include but are not limited to: lights, video cameras, earplugs, fishing lures, fishing tackle, clippers and other toiletries, compasses, sun block, speakers, medication, clocks/watches, safety reflectors, cigar cutters, bottle openers, key chains, laser pointers, laser sensors, radio transmitters, GPS devices, remotes, first aid kits, nametags, small tools such as tape measures or small screwdrivers, and the like.

Lastly, the devices may be used to hold things together without affixing them to anything else. For example the devices of the disclosure may be used as a ponytail holder. In another embodiment they can be used to hold together wire or rope. In still another embodiment, the closures may be used for closing food bags, bags of charcoal, animal feed bags, and the like.

Figure 8:
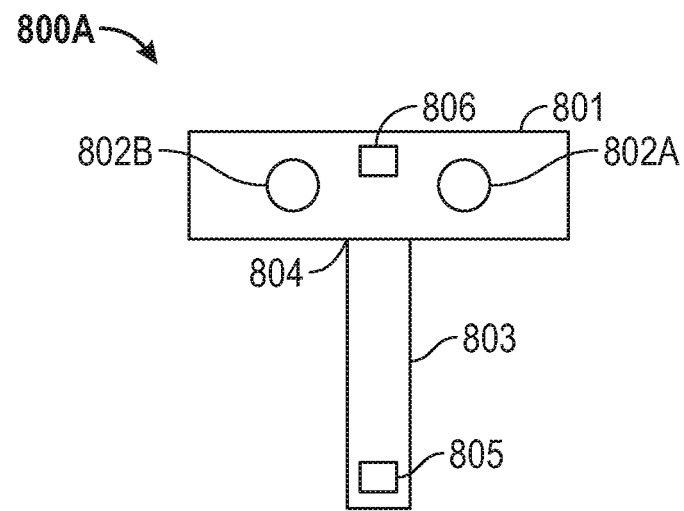
FIG. 8 illustrates a first embodiment of a device for attaching a magnetic object to a Tablet PC or other electronic device comprising a substrate having a first surface configured to receive the magnetic object, a second surface having an adhesive which serves to secure the device to the Tablet PC or other electronic device, and at least one band connected to the substrate using a living hinge which is configured to wrap around the magnetic device.

In another embodiment, the invention is a device for attaching a magnetic object to a Tablet PC or other electronic device comprising a substrate having a first surface configured to receive the magnetic object, a second surface having an adhesive which serves to secure the device to the Tablet PC or other electronic device, and at least one band connected to the substrate using a living hinge which is configured to wrap around the magnetic device to secure it to the first surface of the device. Turning to FIG. 8, a first embodiment of this device 800A is shown wherein a substrate 801 is illustrated with two magnets (802A) and (802B) which are configured to match up with an area of magnetic attraction on the magnetic object (not shown). In this embodiment, there is one band employed (803) which has a living hinge at its point of attachment (804) to the substrate. On this band is a magnet (805) which has a polarity such that when the strap is bent around the magnetic object, this magnet is attracted to the magnet on the substrate designated (806).

In using this device, the magnetic object is first placed on the band and the band wrapped around the object so that when the object is placed onto the substrate the magnet on the band (805) engages with the magnet on the substrate (806). The magnetic object is further secured to the substrate by the other two magnets situated thereon (802 A&B).

This device may be affixed to the Tablet PC or other electronic device using any adhesive known to be useful to those of ordinary skill in the art. For example, in one embodiment, the adhesive may be a permanent adhesive such as an acrylic glue. In another embodiment though, the adhesive may be a tacky adhesive. This would allow the device to be removed from the Tablet PC or other electronic device which may be desirable to some of those employing the device.

Figure 9:
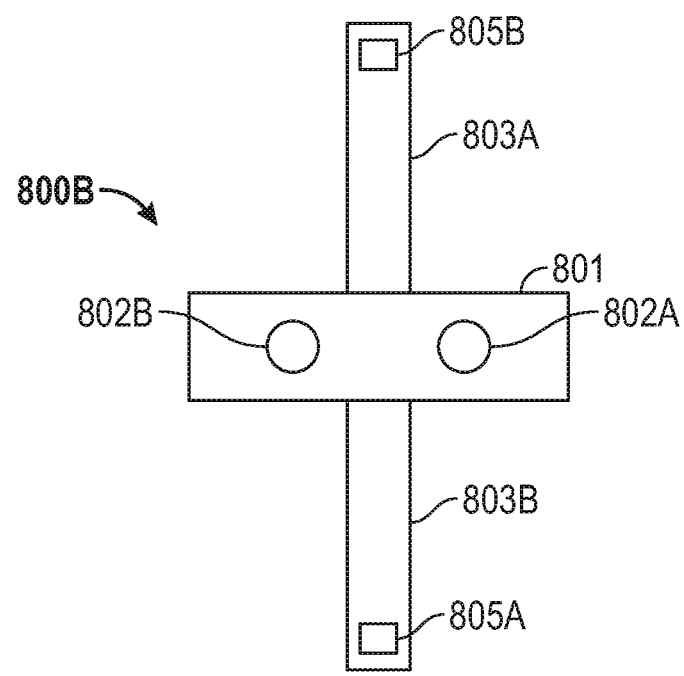
FIG. 9 illustrates a second embodiment of the device illustrated in FIG. 8.

In another embodiment of the device for attaching a magnetic object to a Tablet PC or other electronic device, there are 2 bands rather than one. Turning to FIG. 9, there are now two bands rather than one (803 A&B) and the magnet designated as (806) has been moved to the second band and given a new designation (805B). The other elements remain unchanged.

In using this embodiment, the magnetic object is first placed on the substrate engaging magnets (802 A&B) and then the bands are folded up and over so that magnets (805 A&B) engage to firmly hold the magnetic object in place. While one and two band versions of this embodiment are shown, in some alternative embodiments there may be up to 4 bands. The substrate may be further configured to receive the magnetic object by having structural constructs around the periphery of the substrate to provide further support to the magnetic object.

The bands may be composed of the same material as the substrate or they may be different. For example, in an alternative embodiment, the bands may be made of an elastic material. In such an embodiment, the elasticity may provide further support to secure the magnetic object to the substrate.

Figure 10:
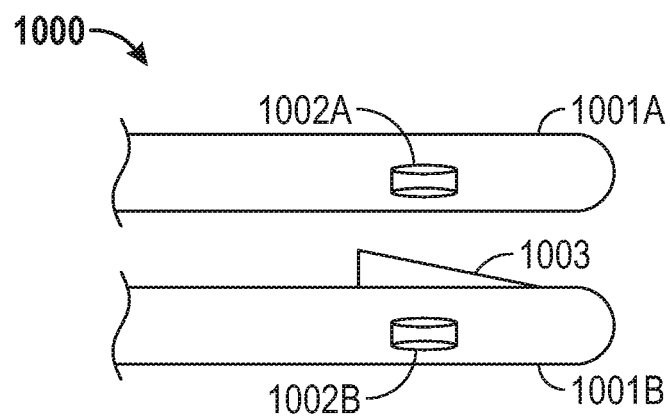
FIG. 10 illustrates an improvement to a device employing at least two magnets wherein the device is configured to receive an object being slid between the two magnets and secure it in place wherein the improvement comprises employing at least one insert between the object and one of the magnets wherein the insert is in the shape of a wedge.

Another embodiment of the invention is an improvement to a device employing at least two magnets wherein the device is configured to receive an object being slid between the two magnets and secure it in place wherein the improvement comprises employing at least one insert between the object and one of the magnets wherein the insert is in the shape of a wedge. Turning to FIG. 10, the device (1000) may be any which employs 2 magnets to fix something in position, such as that illustrated in FIG. 5A. The portion of such a device illustrated here includes a first flap (1001A) and a second flap (1001B) and disposed therein are two magnets (1002 A&B). Interposed on the surface of the bottom flap is a wedge shaped insert (1003). This insert functions by allowing an object being slid between the flaps assert a force vector in parallel to the direction of magnetic attraction. The strength of modern magnets, especially the rare earth magnets, are such that sometimes this additional force vector is necessary in order to separate the magnets to allow the object to be inserted. In this embodiment, only a single insert is shown and it is shown to be on the surface of the flap. It is within the scope of the invention that alternative embodiments could include 2 inserts and they may be disposed within the flap rather than upon it. If disposed upon the flap, it may be desirable to pair the wedge using a nonstick material such as Teflon® to further facilitate sliding the object between the magnets. For example, this embodiment would useful for affixing a pair of glasses to a piece of clothing.

Figure 11:
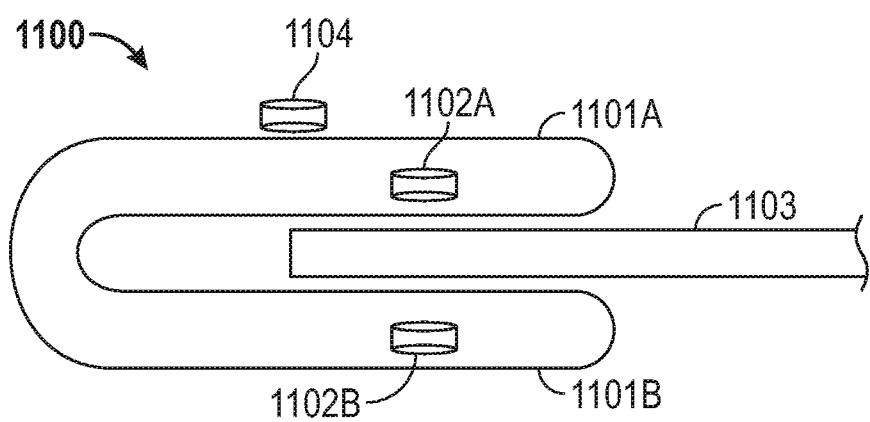
FIG. 11 illustrates a general-purpose device having at least two magnets to secure a substrate to an object wherein the substrate is adaptable to receiving many different components.

In another embodiment, the invention is a general-purpose device having at least two magnets to secure a substrate to an object wherein the substrate is adaptable to receiving many different components. Turning to FIG. 11, the general-purpose device (1100) is illustrated in the secured position around an object (1103) with the force of the magnets (1102 A&B) acting to hold the two flaps of the substrate (1101 A&B) in contact with the object. Another magnet (1104) is shown which is exposed when the substrate is in the secured position. This exposed magnet may be employed to hold other objects. Exemplary of such objects are flowers (such as a corsage or boutonniere), dolls, toys, jewelry, sports items (such as the image of a mascot, fishing tackle and an inspirational inscription), nametags, and even small electronic devices such as a radiofrequency densification device. One use of an RFID device would be to keep track of pets or children on outings. Essentially any object which is not too heavy to be held in place by a magnet could be employed with this device.

With this embodiment the invention, the external magnet does not necessarily have to be external. For example, in some embodiments it may be disposed within the matrix of the substrate. In still another embodiment, one of the magnets acting to hold the substrate in contact with the object can do double duty and also function to hold the component in place on the outside of the substrate.

In addition to the embodiments immediately set forth in the disclosure, combination of features from the different embodiments are also within the scope of the claims. Turning to FIG. 2, note how a cable can be stored for use with the attached device. Now turn to FIG. 6. It is within the scope of the claims to store a cable in a similar manner as to FIG. 4. In this embodiment, a cable (not shown) is stored by wrapping it around the closure over the area designated using reference number 605. When the device is in use, the closure can even be used to store the unused portion of the cable on a sleeve as is shown in FIG. 4 or on a collar (not shown).

The embodiments of the invention of the disclosure incorporate living hinges. In some embodiments, the living hinge may be composed of a material different from the rest of the device. In any embodiment, it may be desirable that the living hinge be composed of a elastic material wherein the elasticity of living hinge serves to further the function of the device.

Figure 12:
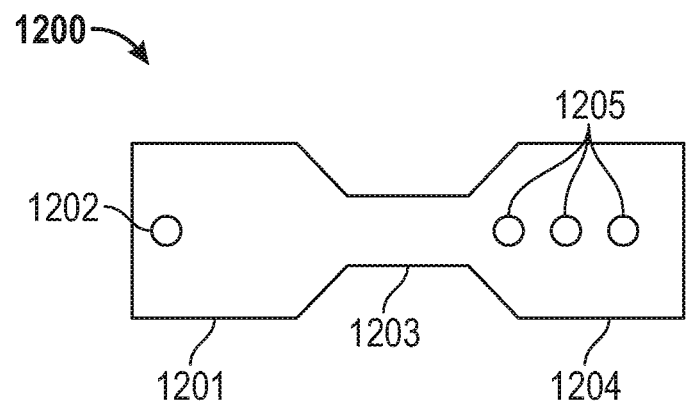
FIG. 12 illustrates a fiber or cord management system having a first tab, a living hinge, and a second tab.

Referencing FIG. 12, in another embodiment, the invention is a fiber or cord management system (1200) comprising a first tab (1201), a living hinge (1203), and a second tab (1204) wherein the living hinge is substantially more narrow than the tabs, the first tab has a single magnet (1202), and the second tab has at least three magnets (1205) having the opposite polarity of the magnet on the first tab wherein the living hinge serves as a substrate upon which the fiber or cord may be wound and the first tab can be positioned to attach to the second tab by overlaying it with a point of attachment selected to maintain tension on the cord or fiber. The magnet of the first tab can be placed upon any of the magnets of the second tab thereby allowing the user to adjust the tension placed on the cord or fibers wrapped upon the living hinge.

Figure 13:
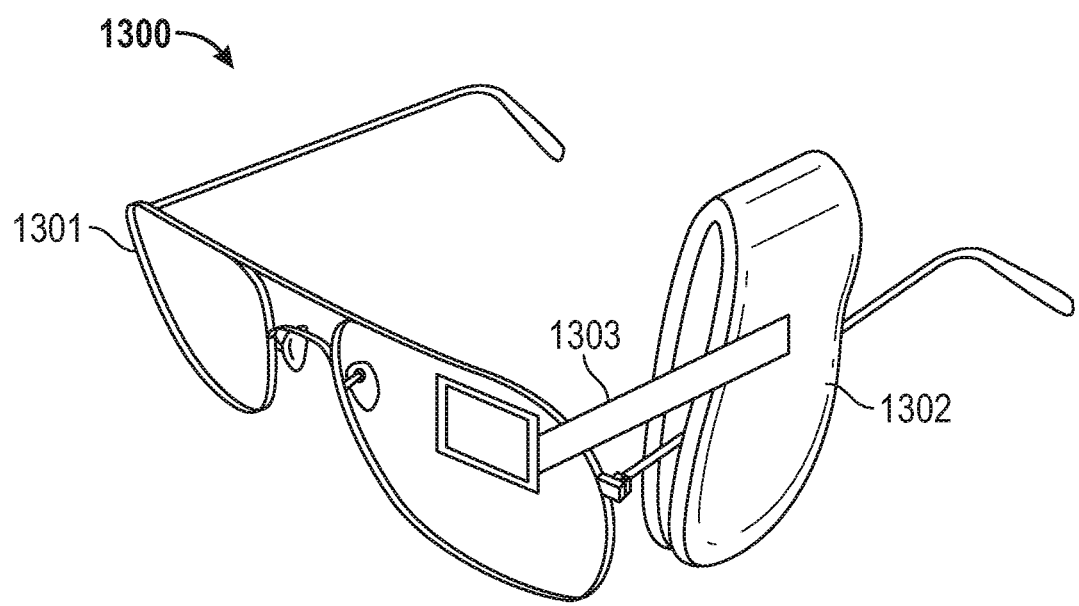
FIG. 13 illustrates a a specific-purpose device having at least two magnets to secure a substrate to an object wherein the substrate is adaptable to receiving components useful in converting a pair of glasses into smart glasses.

Referencing FIG. 13, another embodiment of the invention is a specific-purpose device (1300) having at least two magnets to secure a substrate to an object wherein the substrate is adaptable to receiving components useful in converting a pair of glasses (1301) into smart glasses (see, FIG. 11). For the purposes of the present application, the term "smart glasses" is defined to mean a device worn upon the head like a pair of glasses, but which also has electronic attributes such as, but not limited to, a screen (1303) to display text, graphics or video; speakers and/or a microphone; a power source; a wife or cellular data link; a cell phone; and the like. In some embodiments, all of the electronic components may be on or within the specific purpose device. In other embodiments, one or more of the electronic components may be affixed elsewhere with the caveat that at least one of the electronic elements in on or within the specific purpose device.

Other materials may be incorporated into all embodiments of the invention of the disclosure. For example, cleaner materials useful with the method and apparatus of the application include, but are not limited to fabrics. Exemplary fabrics include microfiber cloths, open-end weave microfiber cloths, double layer cloths wherein the outer layer which would make contact with a view screen is a microfiber cloth, and combinations thereof. For the purposes of this application, the term "fabrics" is defined to further include non-plant materials such as animal skins and/or cloth prepared using synthetic materials or animal materials. In at least one embodiment, the fabric may be a shammy (a.k.a. chamois). In another embodiment, the cleaning material may be the material commonly known in the art as a Micro Shamois Cloth such as is available from iKlear. Any cleaning material that can be used to clean a view screen that does not cause excessive wear or abrasions may be used with the method and apparatus of the application.

Figure 14:
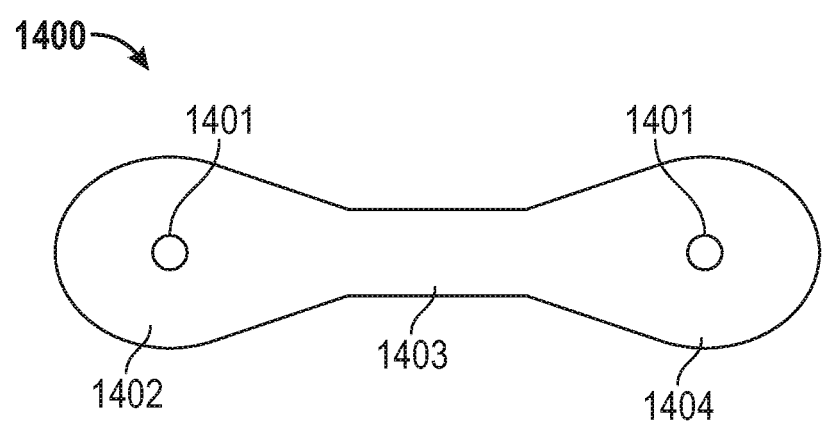
FIG. 14 illustrates a cleaning surface being used with one of the devices of the application.

One example of a cleaning surface being used is shown in FIG. 14. Therein two modules are shown (1404 right only) with a living hinge (1403) between. Two magnets are present (1401) but contained on the interior of the modules. A cleaning surface is present (1402). The cleaning surface may be used to clean both sides of a object such as a glasses lens. Another application of such an embodiment is to use the device to secure the knot in shoes. This is particularly useful with small children who could easily fall from an untied shoe.

Figure 15:
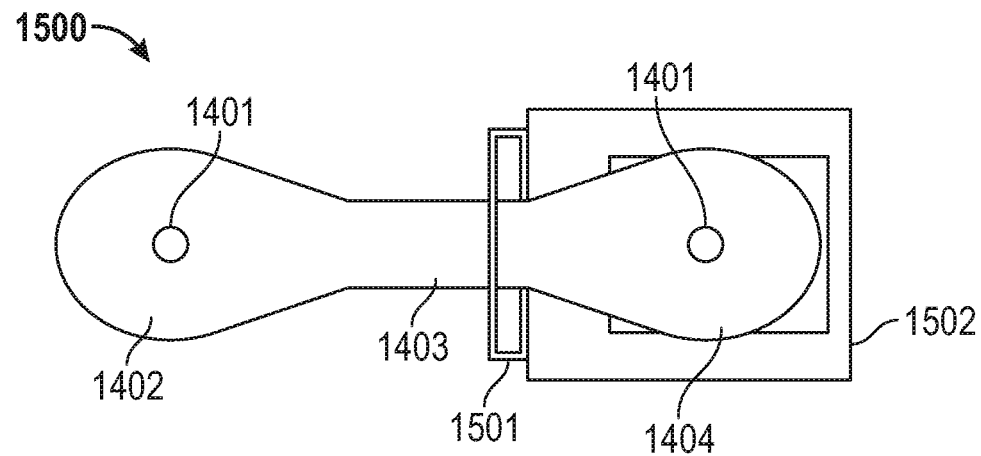
FIG. 15 illustrates one of the devices of the application wherein an electronic component having a slit is attached to the continuous material using the slit.
Figure 16:
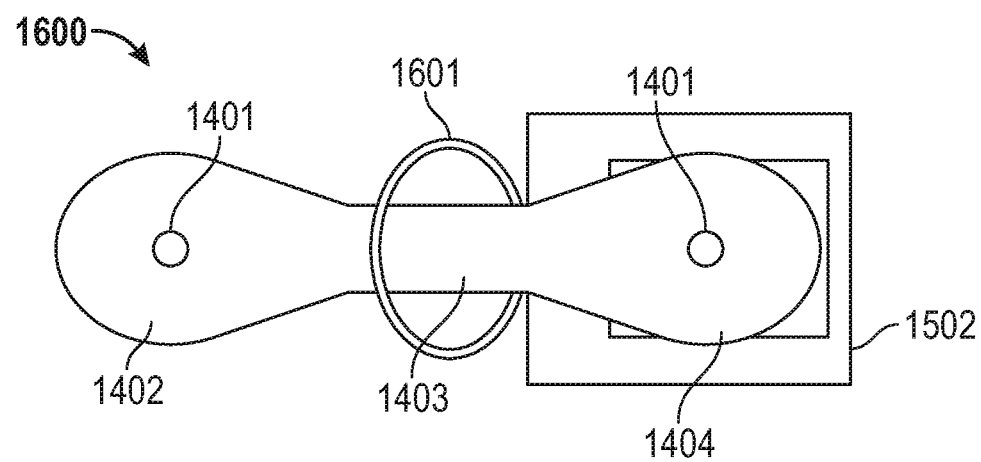
FIG. 16 illustrates one of the devices of the application wherein an electronic component having a loop is attached to the continuous material using the loop.

Turning now to FIGS. 15 and 16, a device of the application similar to that of FIG. 14 shows an electronic component (1502) being attached to the device using a slit (1501) in FIG. 15 and a loop (1601) in FIG. 16.

Figure 17:
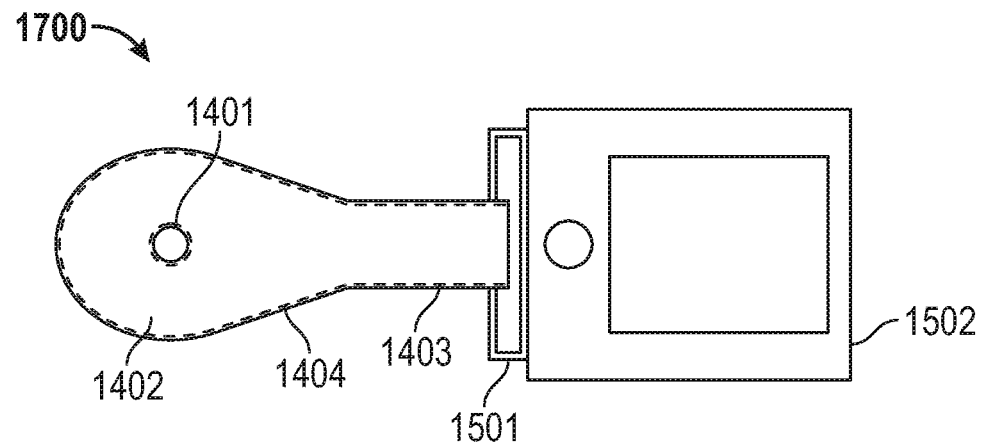
FIG. 17 illustrates the embodiment of FIG. 15 in a closed configuration.

In FIG. 17, the embodiment of FIG. 15 is shown in a closed postion with the two magnets holding the ends of continuous material together.

Figure 18:
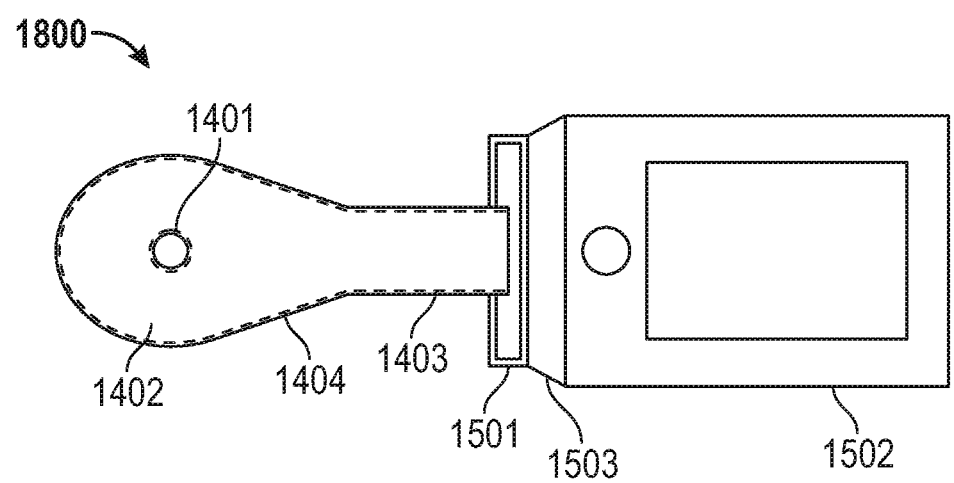
FIG. 18 illustrates one of the devices of the application wherein an electronic component having a loop and a clip is attached to the continuous material using the loop and clip.

In FIG. 18, the embodiment of FIG. 16 is further modified to show the use of a clip.

Any of the embodiments of the invention which can be placed upon clothing or form of transportation may be advantageously to improve visibility, especially at night. For example, any such embodiment may further comprise a reflective or high visibility paint or tape. Applications of such an embodiment can include use with children walking at night or on the back of a disable vehicle.

In this application, the term diamagnetic is used to delineate materials that are not ferromagnetic or ferrimagnetic. From a practical perspective, the materials that are paramagnetic have such a weak attraction to magnets that they would not be effective if utilized and thus are to be treated as if they are diamagnetic.

What is claimed is:

1. An electronic device comprising:
    an electronic component having a view screen and a slit or loop attached to the electronic component by a clip;
    a living hinge formed by a bend of a continuous material defining at least two flexible modules comprising a first module and a second module separated by the bend of the living hinge wherein:
        the continuous material is configured to attach to the slit or loop of the electronic component; and
        a first rare earth magnet located along the first module and a second magnet, rare earth magnet, or a ferromagnetic or a ferrimagnetic substrate located along the second module are configured to attach the electronic device to an object.

2. The electronic device of claim 1 wherein the electronic component is selected from a group consisting of: a watch, a clock, a phone, a GPS device, a radio transmitter, a digital music player, speakers, and combinations thereof.

3. The electronic device of claim 1 wherein the at least two modules separated by the bend of the living hinge have a first and a second magnet and are configured such that the first and second magnets' polarities allow the at least two modules separated by a living hinge to wrap around a target substrate.

4. Electronic device of claim 3 wherein, when attached to a target substrate, the electronic device is configured such that the viewscreen is visible and the electronic component may be used hands free.

5. The device of claim 1 wherein at least one of the two modules is a continuous ferrimagnetic substrate.

6. An electronic device comprising:
    an electronic component having a viewscreen and a slit or loop and a living hinge formed by a bend of a continuous material defining at least two modules comprising a first module and a second module separated by the bend of the living hinge;
wherein:
    the continuous flexible material is configured to attach to the slit or loop of the electronic component;
    a rear earth magnet located along a first module and a ferromagnetic or a ferrimagnetic substrate located along a second module are configured to attach the electronic device around or two an object; and
    the electronic device is configured such that the view screen is visible when attached around or to the object.

7. The electronic device of claim 6 wherein the first module and second module are configured to adjust tension of the continuous material around the object.

8. The electronic device of claim 7 wherein, when attached to a target substrate the electronic device is configured such that the electronic component may be used hands free.

9. The device of claim 8 wherein at least one of the two modules is a continuous ferrimagnetic substrate.

10. The device of claim 6 wherein there are at least two living hinges.

11. The device of claim 6 wherein at least one of the modules has a tab located at the end of the continuous material.

12. The device of claim 11 wherein the tab includes a magnet.

* * * * *